United States Patent
Liu et al.

(10) Patent No.: US 6,880,382 B2
(45) Date of Patent: Apr. 19, 2005

(54) LEAKAGE DETECTING METHOD FOR USE IN OXIDIZING SYSTEM OF FORMING OXIDE LAYER

(75) Inventors: Yung Nan Liu, Hsinchu (TW); Cheng Kuo Tsou, Hsinchu (TW); Yuh Ju Lee, Hsinchu (TW); Ching Cheng Hsieh, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 10/652,664

(22) Filed: Aug. 28, 2003

(65) Prior Publication Data

US 2004/0103715 A1 Jun. 3, 2004

(30) Foreign Application Priority Data

Dec. 3, 2002 (TW) ........................................ 91135066 A

(51) Int. Cl.[7] .................................................. G01M 3/16
(52) U.S. Cl. ........................ 73/40.7; 73/40; 73/865.8; 436/2; 702/51
(58) Field of Search ...................... 73/40, 40.7, 865.8; 436/2; 702/51

(56) References Cited

U.S. PATENT DOCUMENTS 6,267,158 B1 * 7/2001 Saga ........................ 141/94

FOREIGN PATENT DOCUMENTS

JP 2000-353738 * 12/2000 .................. 141/94

* cited by examiner

Primary Examiner—Daniel S. Larkin
(74) Attorney, Agent, or Firm—Townsend and Townsend and Crew LLP

(57) ABSTRACT

Embodiments of the present invention are directed to providing a leakage detecting method for use in an oxidizing system of forming an oxide layer so as to shorten leakage detecting time period. In one embodiment, a leakage detecting method for use in an oxidizing system of forming an oxide layer comprises performing oxidizing processes on a plurality of test wafers in a plurality of test runs under a specified operating condition in an oxidizing system having an oxidizing chamber to form oxide layers on the test wafers having a plurality of oxide thicknesses for the plurality of test runs by flowing an oxidizing gas through the oxidizing chamber containing the test wafers. An oxygen concentration of the oxidizing gas exiting the oxidizing chamber is measured in each of the plurality of test runs. The method further comprises obtaining a correlation between the measured oxygen concentrations and the oxide thicknesses for the plurality of test runs to identify a threshold oxygen concentration corresponding to a maximum acceptable oxide thickness. An oxygen concentration greater than the threshold oxygen concentration indicates gas leakage in the oxidizing system.

8 Claims, 4 Drawing Sheets

LEAKAGE DETECTING METHOD FOR USE IN OXIDIZING SYSTEM OF FORMING OXIDE LAYER

CROSS-REFERENCES TO RELATED APPLICATIONS

This application claims priority from R.O.C. Patent Application No.091135066, filed Dec. 3, 2002, the entire disclosure of which is incorporated herein by reference.

BACKGROUND OF THE INVENTION

The present invention relates to a leakage detecting method and, more particularly, to a leakage detecting method for use in an oxidizing system of forming oxide layers. The present invention also relates to a method for estimating a thickness of an oxide layer formed on a wafer.

The growth of a silicon dioxide layer is very important for achieving high quality of the integrated circuits. Generally, two processes are widely used form silicon dioxide layers. One process is employed to form native oxide layers, and the other process is used to form thermal oxide layers.

The process for forming a native oxide layer is performed by exposing a silicon wafer to an oxygen-containing atmosphere such as oxygen gas or steam at about room temperature. The native oxide layer grows very slowly and generally has a thickness of about 10 to 20 Å. The mechanism for forming a native oxide layer can be illustrated as one of the following reactions:

$$Si(s)+O_2(g) \rightarrow SiO_2(s) \tag{1}$$

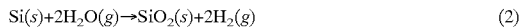

$$Si(s)+2H_2O(g) \rightarrow SiO_2(s)+2H_2(g) \tag{2}$$

The formulae (1) and (2) are usually referred to as dry oxidation and wet oxidation, respectively. Under some circumstances, native oxide layers are useful for enhancing interface properties between the surface of a semiconductor substrate and an insulator layer so as to provide high-quality electrical insulators for electrical isolation of a semiconductor device. Under some circumstances, due to many polar groups carried by the native oxide layers, some organic molecules having polar groups might be bonded to native oxide layers via hydrogen bonds or hydrophobic bonds. As the thicknesses of the native oxide layers increase to some extent, their interface properties will decrease and their irregular morphology might lead to the increase of surface roughness. Therefore, the growth of the native oxide layer needs to be stopped when the thickness reaches about 20 Å.

The process for forming a thermal oxide layer is performed at a temperature ranging from about 700° C. to about 1200° C. by dry oxidation or wet oxidation as described above. Depending on applications of the semiconductor devices, the thermal oxide layer generally has a thickness of about 300 to about 20,000 Å. The thermal oxide layers are suitable for use in forming, for example, a field oxide layer, a dielectric layer, a gate oxide layer, and the like.

FIG. 1 is a schematic view illustrating a typical oxidizing system for forming an oxide layer on a wafer by means of a wet oxidation process. Such an oxidizing system comprises a quartz furnace tube 11, a torch 12, a steam chamber 13 and a piping system. The piping system principally comprises some feeding pipes for introducing reacting gases and purge gas, and an exhaust pipe (not shown) for discharging exhaust gases. The reacting gases generally comprise hydrogen gas ($H_2$) and oxygen gas ($O_2$) for a wet oxidation process. Alternatively, for a dry oxidation process, only oxygen gas is required for forming oxide layers. The purge gas such as nitrogen ($N_2$) is employed to purge the whole oxidizing system prior to feeding the reacting gases. The valves V1, V2 and V3 in the feeding pipes are used to control the open/close states or flow rates of the nitrogen gas, hydrogen gas and oxygen gas, respectively. The exhaust pipe is usually installed from a top vent of the quartz furnace tube 11 for discharging the exhaust gas after the oxidation.

FIG. 2 (including FIGS. 2A and 2B) is a flowchart illustrating a process for forming an oxide layer on a wafer according to prior art. Such process comprises two main procedures, i.e., a preliminary procedure and a normal oxidizing procedure. The preliminary procedure is performed for ascertaining whether there is a leakage of the overall oxidizing system. The preliminary procedure is described as follows and is shown with reference to FIGS. 1 and 2A. First, a plurality of test wafers are placed into the quartz furnace tube 11 which serves as an oxidizing chamber (Step S11). Then, the valves V2 and V3 are closed, and the valve V1 is kept open (Step S12). In Step S13, nitrogen is introduced into the oxidizing system at a specified flow rate so as to purge the overall oxidizing system for about 5 minutes. Then, the quartz furnace tube 11 is heated to an operating temperature for forming oxide layers on the test wafers, e.g., 800 to 1000° C., and maintained at such temperature for about 10 to 20 minutes (Step S14). Then, the temperature of the quartz furnace tube 11 is decreased to about room temperature for about 1 to 1.5 hours (Step S15). Then, as shown in Step S16, the test wafers are removed from the quartz furnace tube 11, and an average thickness d of the oxide layers on the test wafers is measured. If the average thickness d is greater than an acceptable thickness, e.g., 20 Å, it indicates that some leakages might be generated in the piping system or associated connectors. Meanwhile, the actual locations of leakages need to be detected. In addition, some remedial measures should be taken to prevent leakage, such as re-tightening the connectors and/or welding the pipes. To assure that there is no additional leakage in the oxidizing system, the steps S11 to S16 should be repeated.

Alternatively, if the average thickness d is less than the acceptable thickness, it means that no leakage occurs in the oxidizing system. At that time, the normal oxidizing procedure will be performed, as described below with reference to FIG. 2B.

First, a batch of working wafers for forming thereon oxide layers are placed into the quartz furnace tube 11 (Step S21). Then, the valves V2 and V3 are closed, and the valve V1 is kept open (Step S22), and nitrogen is subsequently introduced into the oxidizing system at a specified flow rate so as to purge the overall oxidizing system for about 5 minutes (Step S23). Then, the quartz furnace tube 11 is heated to an operating temperature for forming oxide layers on the working wafers, e.g., 800 to 1000° C., and maintained at such temperature for about 10 to 20 minutes (Step S24). Then, the valve V1 is closed, and the valves V2 and V3 are opened in order to introduce oxygen and hydrogen gases into the torch 12 (Step S25). The oxygen and hydrogen gases combined in the torch 12 will ignite and burn to produce steam. The steam enters the steam chamber 13 and the quartz furnace tube 11. Depending on the application, the processing time is controlled to form a desirable thickness for each oxide layer on the working wafers (Step S26).

The above-mentioned preliminary procedure has some drawbacks. For example, the preliminary procedure is time-consuming for detecting leakage of the overall oxidizing system, because the average oxide layer thickness of the test wafers is obtained after the quartz furnace tube 11 has been cooled down. In addition, if some leakages are likely to be generated, it is necessary to re-tighten the connectors and/or weld the pipes and carry out the above preliminary procedure again until no leakage is detected. That is to say, when some leakages occur, the preliminary procedure will be carried out at least two times. Since every preliminary procedure takes about 1.5–2 hours, it takes a relatively long time period, e.g., approximately 0.5 to 1.0 day, and wastes a substantial number of test wafers for testing the leaking condition. Therefore, there is a need to develop an improved process for detecting a leaking condition of the oxidizing system so as to overcome the above-mentioned problems.

BRIEF SUMMARY OF THE INVENTION

Embodiments of the present invention are directed to providing a leakage detecting method for use in an oxidizing system of forming an oxide layer so as to shorten leakage detecting time period. A method is also provided for estimating a thickness of an oxide layer formed on a wafer.

In accordance with an aspect of the present invention, a leakage detecting method for use in an oxidizing system of forming an oxide layer comprises performing oxidizing processes on a plurality of test wafers in a plurality of test runs under a specified operating condition in an oxidizing system having an oxidizing chamber to form oxide layers on the test wafers having a plurality of oxide thicknesses for the plurality of test runs by flowing an oxidizing gas through the oxidizing chamber containing the test wafers. An oxygen concentration of the oxidizing gas exiting the oxidizing chamber is measured in each of the plurality of test runs. The method further comprises obtaining a correlation between the measured oxygen concentrations and the oxide thicknesses for the plurality of test runs to identify a threshold oxygen concentration corresponding to a maximum acceptable oxide thickness. An oxygen concentration greater than the threshold oxygen concentration indicates gas leakage in the oxidizing system.

In some embodiments, the oxygen concentration of the oxidizing gas exiting the oxidizing chamber is measured by an oxygen analyzer disposed downstream of the oxidizing chamber. The oxide thickness for each test run is an average oxide thickness of the oxide thicknesses on a plurality of test wafers in the test run. The maximum acceptable oxide thickness is about 20 Å. The specified operating condition comprises a temperature from about 700° C. to 1200° C. and an oxidizing time period from about 10 to 20 minutes.

In specific embodiments, the method further comprises performing an oxidizing process on at least one working wafer under the specified operating condition in the oxidizing system to form an oxide layer on the at least one working wafer by flowing an oxidizing gas through the oxidizing chamber containing the at least one working wafer, measuring an oxygen concentration of the oxidizing gas exiting the oxidizing chamber, and determining whether there is gas leakage in the oxidizing system by comparing the measured oxygen concentration with the threshold oxygen concentration multiplied by a safety factor. There is no gas leakage in the oxidizing system when the measured oxygen concentration is lower than the threshold oxygen concentration multiplied by the safety factor. The safety factor may be about 0.9. An inert gas is introduced into the oxidizing system to purge the oxidizing system prior to performing the oxidizing process on the at least one working wafer. The inert gas comprises nitrogen.

The method may include at least one of re-tightening one or more connectors and welding one or more pipes in the oxidizing system, upon detecting a gas leakage in the oxidizing system when the measured oxygen concentration is greater than the threshold oxygen concentration multiplied by the safety factor. The method may further include estimating a thickness of the oxide layer on the at least one working wafer based on the measured oxygen concentration of the oxidizing gas exiting the oxidizing chamber and the correlation between the measured oxygen concentration and the oxide thicknesses.

In accordance with another aspect of the invention, a method for estimating a thickness of an oxide layer formed on a wafer comprises providing an oxidizing system having an oxidizing chamber for forming an oxide layer on one or more substrates by flowing an oxidizing gas through the oxidizing chamber. A working wafer is placed in the oxidizing chamber of the oxidizing system. An oxidizing process is performed on the working wafer under the specified operating condition to form an oxide layer on the working wafer by flowing the oxidizing gas through the oxidizing chamber. The method further comprises measuring an oxygen concentration of the oxidizing gas exiting the oxidizing chamber, and estimating a thickness of said oxide layer according to the measured oxygen concentration and a previously determined relation between oxide layer thicknesses formed on test substrates placed in the oxidizing chamber and oxygen concentrations of gases exiting the oxidizing chamber in test runs of oxidizing processes performed on the test substrates under a specified operating condition.

In some embodiments, the method further comprises, prior to placing the working wafer in the oxidizing chamber, performing a checking procedure to ascertain that there is no leakage in the oxidizing system according to the previously determined relation between oxide layer thicknesses formed on test substrates placed in the oxidizing chamber and oxygen concentrations of gases exiting the oxidizing chamber. Performing the checking procedure comprises placing a working wafer in the oxidizing chamber of the oxidizing system, performing an oxidizing process on the working wafer under the specified operating condition to form an oxide layer on the working wafer by flowing the oxidizing gas through the oxidizing chamber, measuring an oxygen concentration of the oxidizing gas exiting the oxidizing chamber, and determining whether there is gas leakage in the oxidizing system by comparing the measured oxygen concentration with the threshold oxygen concentration multiplied by a safety factor. There is no gas leakage in the oxidizing system when the measured oxygen concentration is lower than the threshold oxygen concentration multiplied by the safety factor.

BRIEF DESCRIPTION OF THE DRAWINGS

FIG. 2 is a flowchart illustrating a process for forming an oxide layer on a wafer according to prior art, wherein

DETAILED DESCRIPTION OF THE INVENTION

Figure 1:
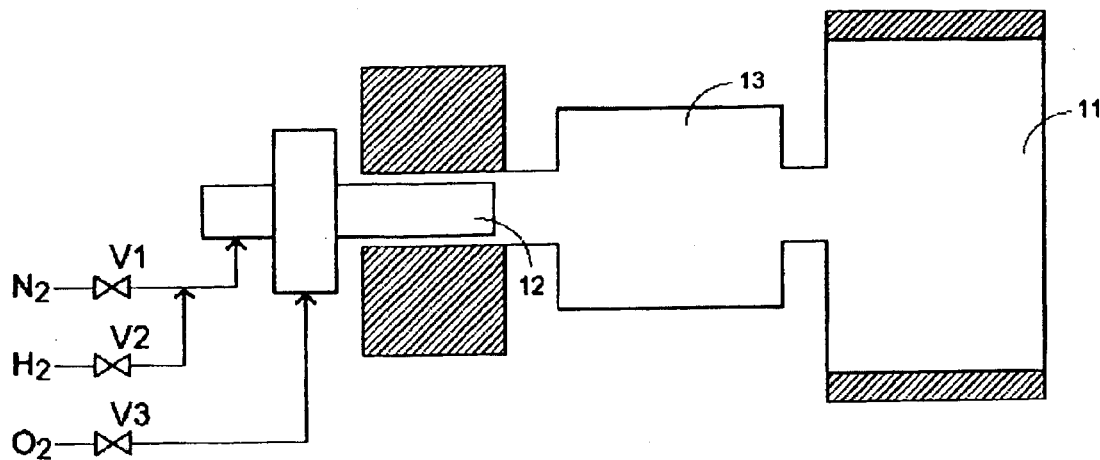
FIG. 1 is a schematic view illustrating a typical oxidizing system for forming an oxide layer on a wafer.
Figure 2B:
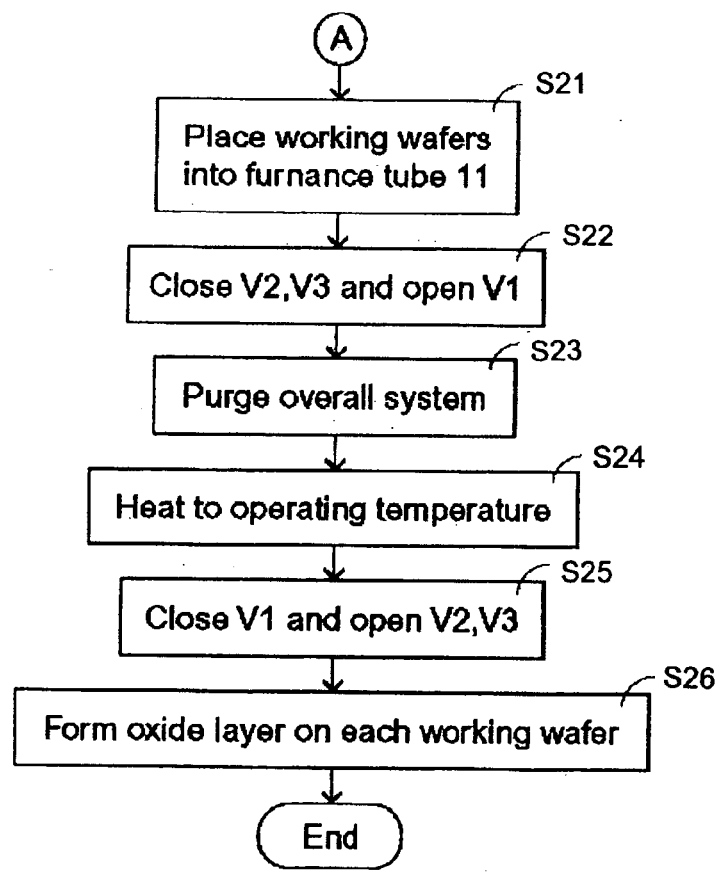
FIG. 2B is the flowchart showing the normal oxidizing procedure.
Figure 2A:
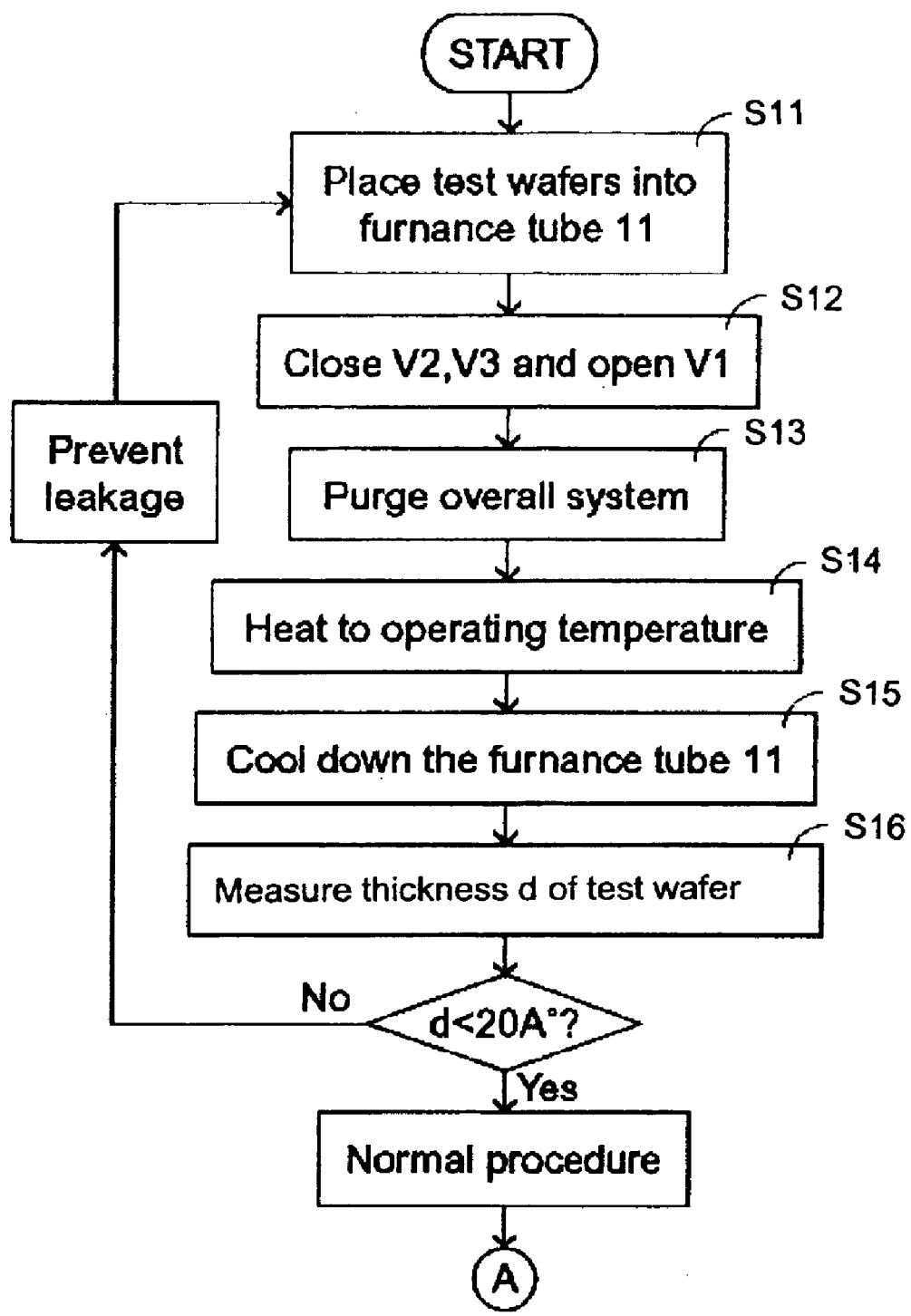
FIG. 2A is the flowchart showing the preliminary procedure.
Figure 3:
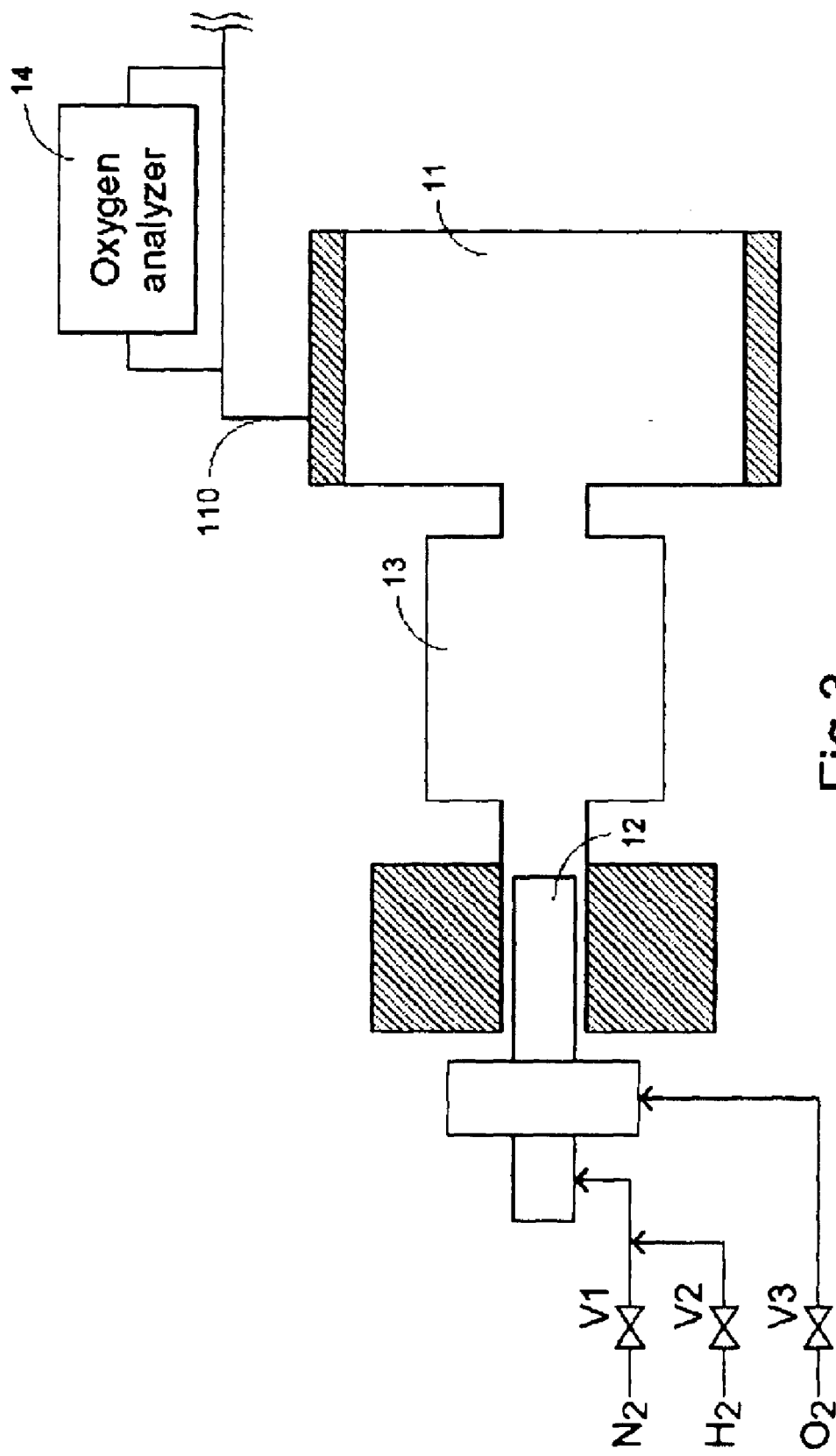
FIG. 3 is a schematic view illustrating an oxidizing system for forming an oxide layer on a wafer according to an embodiment of the present invention.

FIG. 3 schematically illustrates an embodiment of an oxidizing system used in the present invention to form an oxide layer on a wafer. The elements corresponding to those of FIG. 1 are designated by identical numeral references, and detailed description thereof is omitted. The oxidizing system shown in FIG. 3 comprises a quartz furnace tube 11, a torch 12, a steam chamber 13, an oxygen analyzer 14 and a piping system. The oxygen analyzer 14 may be installed in a bypass of an exhaust pipe 110. The operating principle of the oxygen analyzer is well known in the art.

By utilizing the oxygen analyzer 14, the oxygen concentration of the exhaust gases from the quartz furnace tube 11 could be on-line detected. Furthermore, the purposes of minimizing the test wafers and reducing time period for testing leaking conditions can be achieved accordingly. The utility of the oxygen analyzer is described in greater details as follows.

In advance, a diagram illustrating a relation between oxide layer thickness and oxygen concentration is obtained by performing test runs on a plurality of batches of test wafers. First, a first batch of test wafers is placed into the quartz furnace tube 11. The valves V2 and V3 are closed, and the valve V1 is kept open. Nitrogen gas is introduced into the oxidizing system at a specified flow rate, e.g., about 6,000 to 10,000 sccm, so as to purge the overall oxidizing system for about 5 minutes. Then, the quartz furnace tube 11 is heated to an operating temperature for forming oxide layers on the test wafers, e.g., about 800 to 1000° C., and maintained at such temperature for about 10 to 20 minutes so as to form an oxide layer on each of the test wafers. Meanwhile, a reference oxygen concentration C1 of the exhaust gas is detected by the oxygen analyzer 14. Then, the temperature of the quartz furnace tube 11 is decreased to about room temperature for about 1 to 1.5 hours. The first batch of test wafers is removed from the quartz furnace tube 11, and an average thickness d1 of the oxide layers on the test wafers is measured. After changing flow rates of the nitrogen gases, the above-mentioned procedures are repeated for the same oxidizing system by successively placing second, third, fourth, . . . , and nth batches of test wafers into the quartz furnace tube 11, and detecting other reference oxygen concentrations C2, C3, C4, . . . , Cn and average oxide layer thicknesses d2, d3, d4, . . . , dn for each batch of test wafers, respectively. The relation of reference oxygen concentration (C) and reference oxide layer thickness (d) is plotted in a diagram as shown in FIG. 4.

Figure 4:
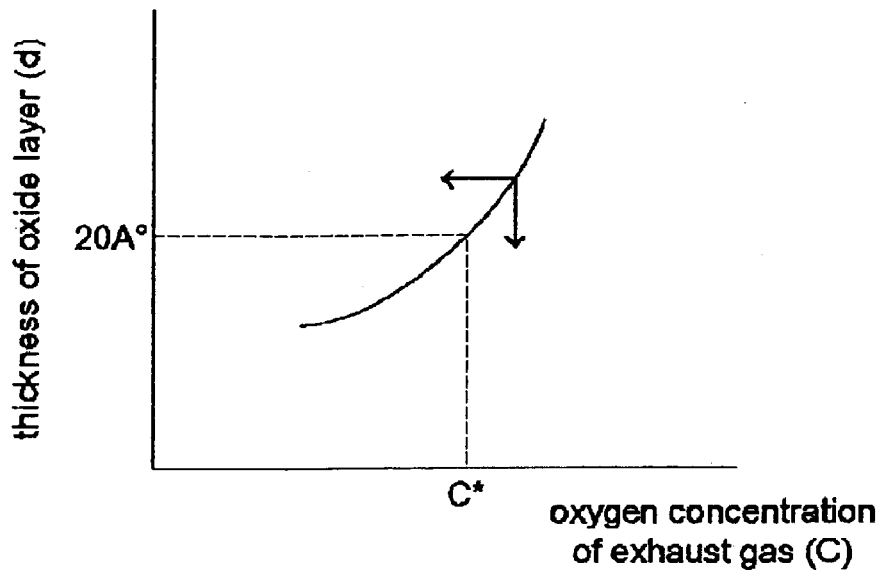
FIG. 4 is schematic plot illustrating an oxide layer thickness vs. oxygen concentration detected by an oxygen analyzer in an embodiment of the invention.

As shown in FIG. 4, the oxygen concentrations of exhaust gases are positively related to the average oxide layer thickness of the test wafers. As previously described, the thickness of a wafer prior to performing a normal oxidizing procedure should be controlled below an acceptable thickness, e.g., 20 Å. Referring to FIG. 4, the acceptable thickness is correlated to an acceptable oxygen concentration C* of the exhaust gas. In addition, when experimental errors are taken into account, approximately 90% or less than 90% of the acceptable oxygen concentration C* may be used as a threshold value. That is to say, when a measured oxygen concentration is less than the threshold value (0.9C*), it is assured that no leakage occur in the oxidizing system, and thus the normal oxidizing procedure can be performed.

After the threshold value is obtained, the process for forming an oxide layers on a wafer to be oxidized can be simplified as follows.

Figure 5:
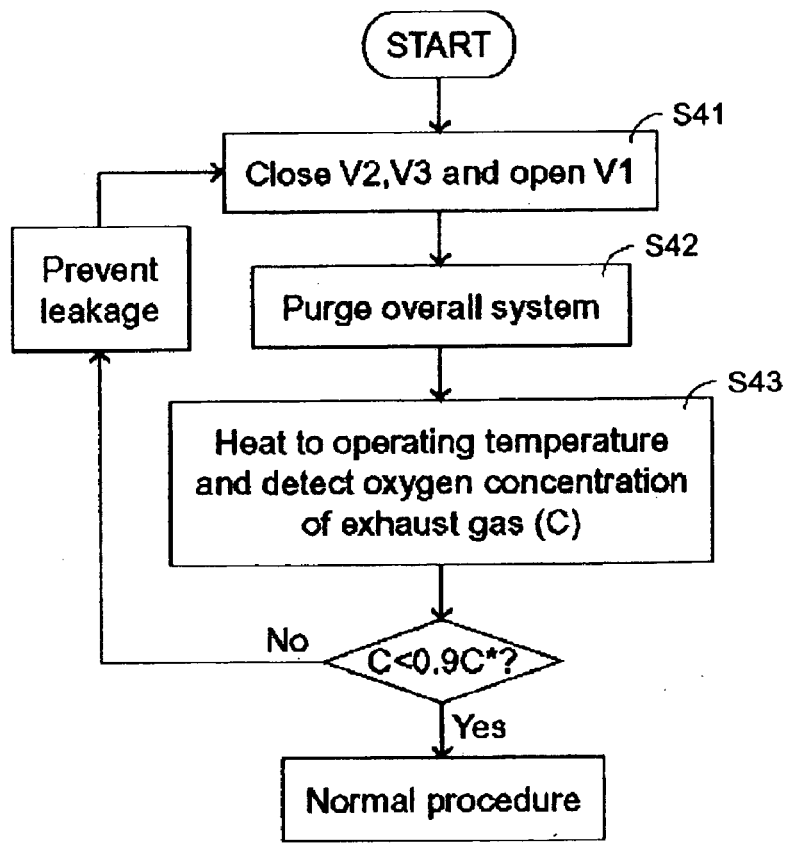
FIG. 5 is a flowchart illustrating a process for forming an oxide layer on a wafer according to an embodiment of the present invention.

In accordance with an embodiment of the present invention, the process for forming an oxide layer on a wafer to be oxidized comprises a checking procedure and a normal oxidizing procedure. The checking procedure is done for a purpose of detecting leakage of the overall oxidizing system, and replaces the preliminary procedure in the prior art. The checking procedure of the present invention is more convenient than the preliminary procedure in the prior art. In a case that the oxidizing system has not been operated for a relatively long time period, the checking procedure will be performed in order to check the overall oxidizing system. However, no test wafers are needed in such checking procedure. The steps for performing the checking procedure are illustrated in the flowchart of FIG. 5 and described as follows in details. First, the valves V2 and V3 are closed, and the valve V1 is kept open (Step S41). Nitrogen gas is introduced into the oxidizing system at a specified flow rate to purge the overall oxidizing system for a period of time (e.g., about 5 minutes). The specified flow rate may be substantially the same as that used for the test wafers (Step S42). Then, the quartz furnace tube 11 is heated to an operating temperature for forming oxide layers on the test wafers, e.g., about 800 to 1000° C., and maintained at such temperature typically for about 10 to 20 minutes so as to form an oxide layer on each of the test wafers. Meanwhile, an oxygen concentration C of the exhaust gas is detected by the oxygen analyzer 14 (Step S43). If the detected oxygen concentration C is greater than the threshold value, e.g., 0.9C*, some regular remedial measures are carried out to prevent leakage, such as re-tightening the connectors and/or welding the pipes. Then, the steps S41 to S43 are repeated until the oxygen concentration detected by the oxygen analyzer is less than the threshold value. At that time, the general normal oxidizing procedure, i.e., the steps S21 to S26, may proceed so as to form oxide layers on the working wafers.

As will be apparent from the above descriptions according to the present invention, the checking procedure of the present invention can be applied to estimate thicknesses of oxide layers by on-line detecting oxygen concentration. Furthermore, the checking procedure has some advantages. One advantage is that no test wafers need to be placed into the oxidizing system for performing the checking procedure. Instead, the oxygen concentration detected by the oxygen analyzer is an indication of a possible leaking condition. Every detecting course typically takes approximately 5 minutes. Since no test wafer is required to be removed, the quartz furnace tube 11 will no longer need to be cooled down for measuring oxide layer thickness. Every cooling course takes about 1 to 1.5 hours. Especially when some leakages are detected, the advantages of the present checking procedure become more apparent. Therefore, the checking procedure of the present invention is more user-friendly, time-saving and cost-effective.

The present invention is illustrated by referring to a wet oxidation process. Nevertheless, the present invention can be applied to a dry oxidation process for forming oxide layers. Furthermore, the relation between oxide layer thickness and oxygen concentration will need to be re-determined once the quartz furnace tube refreshes a new one or the associated oxidizing condition varies. In some cases, the relation plot can be provided by suppliers of quartz furnace tubes.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A leakage detecting method for use in an oxidizing system of forming an oxide layer, the method comprising the steps of:
   (a) providing an oxidizing system having an oxidizing chamber and an oxygen concentration analyzer installed in a bypass of an exhaust pipe of said oxidizing chamber;
   (b) performing an oxidizing process on a test wafer in a test run under a specified operating condition in said oxidizing system by flowing an oxidizing gas through said oxidizing chamber containing said test wafer;
   (c) measuring an oxygen concentration of said oxidizing gas exiting said oxidizing chamber in said test run by said oxygen concentration analyzer;
   (d) measuring the oxide thickness of said test wafer after said test run;
   (e) repeating (b), (c), and (d) for a plurality of test runs to obtain a correlation between the measured oxygen concentration and the oxide thickness for the plurality of test runs to identify an acceptable oxygen concentration corresponding to a maximum acceptable oxide thickness, wherein an oxygen concentration greater than said acceptable oxygen concentration indicates gas leakage in said oxidizing system;
   (f) selecting a safety factor and multiplying said acceptable oxygen concentration with said safety factor to get a threshold oxygen concentration;
   (g) performing a general oxidizing process on a working wafer under said specified operating condition in said oxidizing system; wherein while said oxygen concentration analyzer starts to measure an oxygen concentration of said oxidizing gas exiting said oxidizing chamber, if said measured oxygen concentration is greater than said threshold oxygen concentration, an indication of gas leakage exists in said oxidizing system.

2. The method of claim 1 wherein said maximum acceptable oxide thickness is about 20 Å.

3. The method of claim 1 wherein said specified operating condition comprises a temperature from about 700° C. to 1200° C. and an oxidizing time period from about 10 to 20 minutes.

4. The method of claim 1 wherein said safety factor is about 0.9.

5. The method of claim 1 further comprising introducing an inert gas into said oxidizing system to purge said oxidizing system prior to performing said oxidizing process.

6. The method of claim 5 wherein said inert gas comprises nitrogen.

7. The method of claim 1 further comprising at least one action of re-tightening one or more connectors and welding one or more pipes in said oxidizing system, upon detecting a gas leakage in said oxidizing system when said measured oxygen concentration is greater than said threshold oxygen concentration.

8. The method of claim 1 further comprising ascertaining that there is no gas leakage in said oxidizing system when the measured oxygen concentration is lower than said threshold oxygen concentration, and performing an oxidizing process on at least one working wafer under said specified operating condition in said oxidizing system to form the oxide layer on said working wafer.

* * * * *